(12) United States Patent
Sarkisian et al.

(10) Patent No.: US 8,452,573 B2
(45) Date of Patent: May 28, 2013

(54) CARBON FOOTPRINT ANALYSIS TOOL FOR STRUCTURES

(75) Inventors: Mark Sarkisian, San Anselmo, CA (US); Geoffrey Brunn, Berkeley, CA (US); Moshen Nasr, San Francisco, CA (US); Lindsay Hu, San Francisco, CA (US)

(73) Assignee: Skidmore, Owings & Merrill LLP, New York, NY (US)

( * ) Notice: Subject to any disclaimer, the term of this patent is extended or adjusted under 35 U.S.C. 154(b) by 610 days.

(21) Appl. No.: 12/697,147

(22) Filed: Jan. 29, 2010

(65) Prior Publication Data

US 2011/0191071 A1    Aug. 4, 2011

(51) Int. Cl.
  *G06F 17/50*    (2006.01)
(52) U.S. Cl.
  USPC ...... 703/1; 703/6; 700/97; 700/106; 700/110; 700/291
(58) Field of Classification Search
  USPC .......................................................... 703/1, 6
  See application file for complete search history.

(56) References Cited

U.S. PATENT DOCUMENTS

| | | | | |
|---|---|---|---|---|
| 5,189,606 A * | 2/1993 | Burns et al. | .................. | 705/7.23 |
| 5,729,452 A * | 3/1998 | Smith et al. | .................. | 701/31.9 |
| 5,835,871 A * | 11/1998 | Smith et al. | .................. | 701/29.3 |
| 5,983,010 A * | 11/1999 | Murdock et al. | .................. | 703/6 |
| 6,117,178 A * | 9/2000 | Whitney et al. | .................. | 703/12 |
| 6,701,281 B2 * | 3/2004 | Satoh et al. | .................. | 702/182 |
| 7,068,161 B2 * | 6/2006 | Germaine et al. | ............ | 340/506 |
| 7,069,158 B2 * | 6/2006 | Gidwani | .................... | 702/56 |
| 7,933,879 B2 * | 4/2011 | Ouzounian | .................. | 707/694 |
| 8,204,619 B2 * | 6/2012 | Heil | ............................. | 700/182 |
| 2002/0194145 A1 * | 12/2002 | Boucher et al. | ............... | 705/500 |
| 2005/0128212 A1 * | 6/2005 | Edecker et al. | ............... | 345/582 |

(Continued)

OTHER PUBLICATIONS

S. Yang, Z. Lin, M. Fu, THe Research on the Environmental Burden of Building Constructs Methods-Case Study on Cat-in-Place-Concrete and Prefabricate Concerete Methods, Jun. 11-13, 2008, 4th IASME/WSEAS International Conference on Energy, Enviroment, Ecosystems and Sustainable Development, pp. 136-143.*

(Continued)

*Primary Examiner* — Thai Phan
*Assistant Examiner* — Kibrom Gebresilassie
(74) *Attorney, Agent, or Firm* — Dentons US LLP

(57) ABSTRACT

An emission estimation apparatus running a program configured to perform a method of calculating the amount of carbon generated during the life span of a structure by displaying a graphical user interface stored in the memory of the apparatus which is configured to gather structural information pertaining of the structure, receiving structural information from the graphical user interface into the memory of the apparatus which includes information pertaining to the size, types of material used in the structure and structural aspects of the structure, generating an estimated amount of carbon generated from the use of each type of material to construct the structure and the labor used to construct the structure based on the structural information received by the processor, estimating, by the processor, the types and amounts of material and labor required to repair the structure after a destructive event occurs based on a calculated probability and magnitude of a destructive event occurring, generating an estimated amount of carbon emitted as a result of the materials used and the labor required to repair the structure after the destructive event occurs, and displaying the total estimated amount of carbon emitted due the construction and repair of the structure on a display unit.

20 Claims, 10 Drawing Sheets

U.S. PATENT DOCUMENTS

| | | | |
|---|---|---|---|
| 2009/0077920 A1* | 3/2009 | Korman et al. | 52/606 |
| 2009/0238648 A1* | 9/2009 | Wilkman | 405/284 |
| 2009/0265049 A1* | 10/2009 | Wise et al. | 701/3 |
| 2009/0281677 A1* | 11/2009 | Botich et al. | 700/295 |
| 2009/0319090 A1* | 12/2009 | Dillon et al. | 700/291 |
| 2010/0042453 A1* | 2/2010 | Scaramellino et al. | 705/7 |
| 2010/0046553 A1* | 2/2010 | Daigle et al. | 370/474 |
| 2010/0057416 A1* | 3/2010 | Peterman et al. | 703/6 |
| 2010/0119409 A1* | 5/2010 | Wiener | 422/4 |
| 2010/0122504 A1* | 5/2010 | Sarkisian et al. | 52/442 |
| 2010/0135119 A1* | 6/2010 | Paget | 367/127 |
| 2010/0296694 A1* | 11/2010 | Little et al. | 382/100 |
| 2011/0004350 A1* | 1/2011 | Cheifetz et al. | 700/276 |
| 2011/0055091 A1* | 3/2011 | Budlong | 705/313 |
| 2011/0107689 A1* | 5/2011 | Holguin et al. | 52/79.1 |
| 2011/0245937 A1* | 10/2011 | Rawson et al. | 700/90 |
| 2011/0246155 A1* | 10/2011 | Fitch et al. | 703/6 |
| 2011/0246381 A1* | 10/2011 | Fitch et al. | 705/313 |
| 2012/0053740 A1* | 3/2012 | Venkatakrishnan et al. | 700/291 |
| 2012/0078685 A1* | 3/2012 | Krebs et al. | 705/7.37 |
| 2012/0173209 A1* | 7/2012 | Krebs et al. | 703/1 |
| 2012/0179431 A1* | 7/2012 | Labrie et al. | 703/1 |
| 2012/0323382 A1* | 12/2012 | Kamel et al. | 700/286 |

OTHER PUBLICATIONS

S. H. Yang, Z. Lin, M. Huang-Fu, "The Research on the Environmental Burden of building constructs Methods-Case Study on Cast-in-Place-Concrete and Prefabricate Concrete Methods", Jun. 11-13, 2008, pp. 136-143.*

* cited by examiner

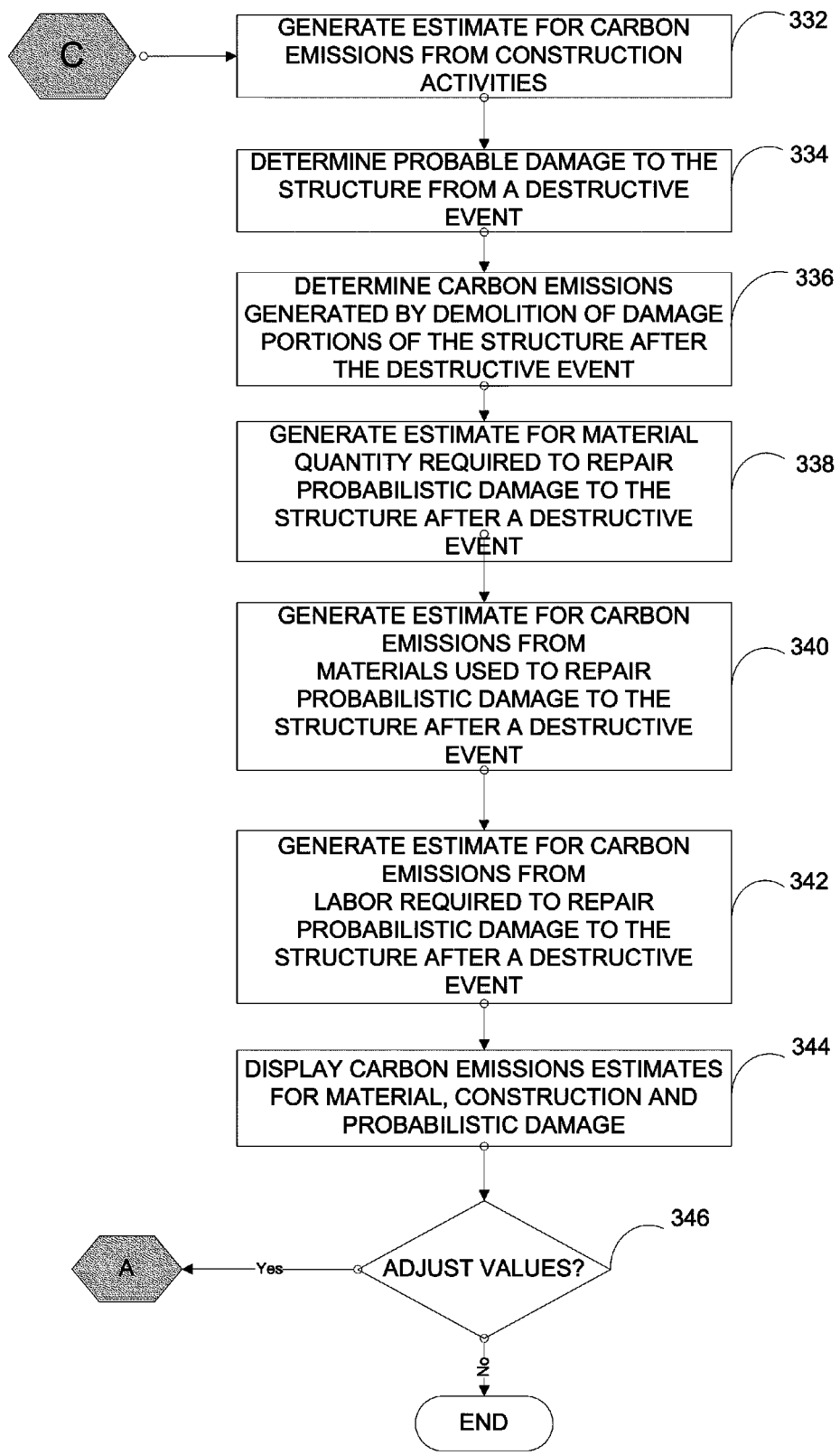

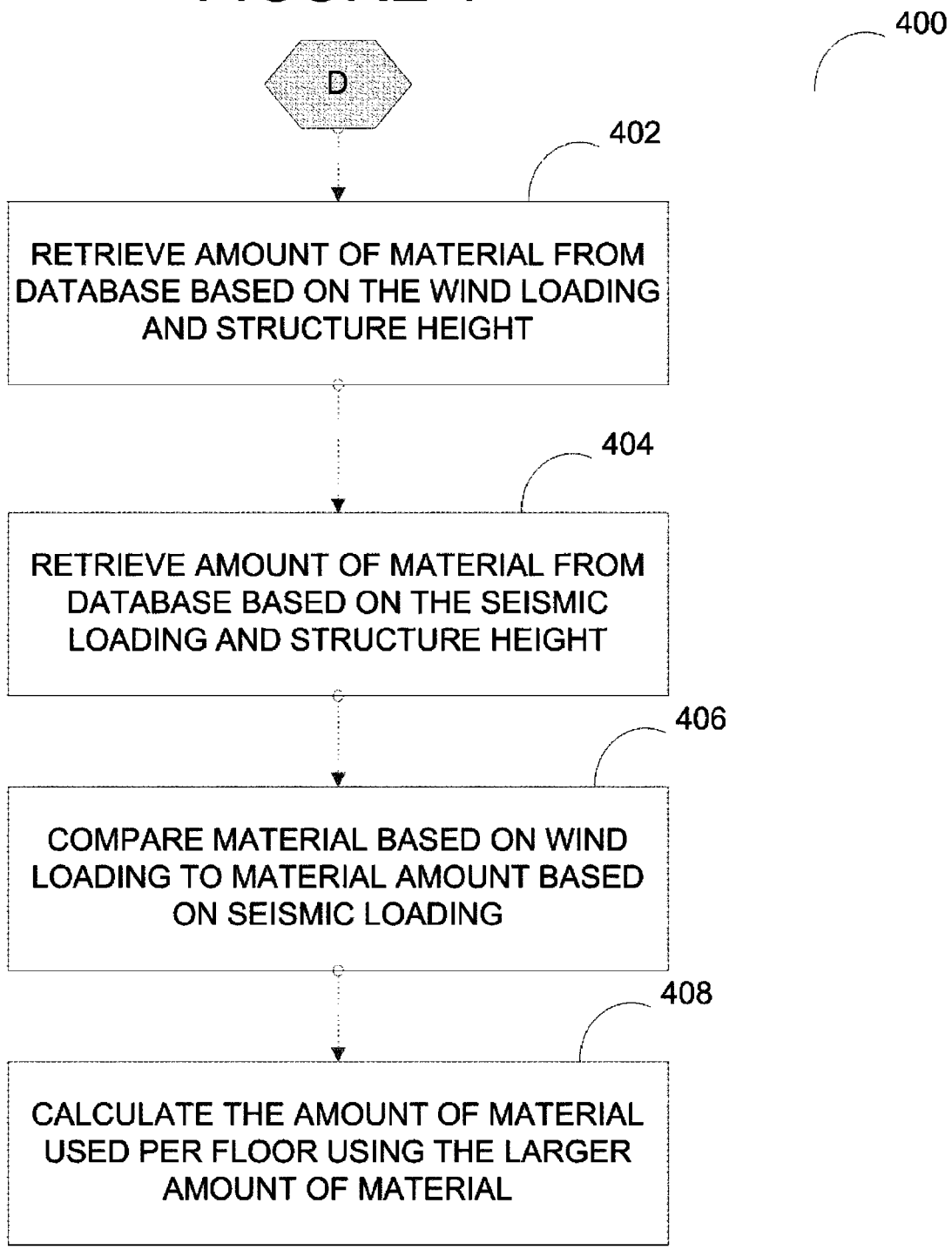

CARBON FOOTPRINT ANALYSIS TOOL FOR STRUCTURES

FIELD OF THE INVENTION

This invention relates to the estimation of the amount of carbon generated during the construction of a structure as well as the carbon generated to repair damage to a structure after a natural or made destructive event including, but not limited to, a seismic, wind, terrorist or other natural or man-made destructive event.

BACKGROUND OF THE INVENTION

A greenhouse gas is generally considered a gas in an atmosphere that absorbs or emits radiation within the thermal infrared range. Greenhouse gases ("GHG") cause the so-called "Greenhouse Effect" which is the heating of the surface of a planet due to the presence of a GHG. The main GHGs are water vapor, carbon dioxide, methane, nitrious oxide and ozone.

A carbon footprint is the total of GHG emissions caused by an entity, organization, event, activity or product. However, for simplicity it is often expressed in the amount of carbon dioxide, or its equivalent of other GHG emitted. Often the word carbon is used and/or interchanged with the term carbon dioxide. Such is the case herein.

The process of constructing a structure involves the use of material, labor and equipment, which each generate GHGs. Specifically, materials used in the construction are made and transported to construction sites using fossil fuels, this process itself produces carbon dioxide among other GHGs. Further, construction of structures requires machinery which burn fossil fuels and the transportation of laborers to the construction site, which also requires the use of fossil fuels.

In addition to the construction of a structure (e.g. buildings), depending on the location of the structure, the structure may be susceptible to damage due to environmental factors including, wind, earthquakes, flooding, etc. Additional material and labor is required to repair the structure after such an event occurs. The resulting demolition of the damaged portions of the structure or the structure in its entirety and the repair of the damage or complete reconstruction produces more carbon dioxide.

It would be beneficial for a system that is capable of estimating the amount of carbon produced during the construction and life span of a structure. Further, it would be beneficial for a system, which will account for damage, which may occur to a structure resulting due to environmental factors.

SUMMARY OF THE INVENTION

In an embodiment, the invention provides an emission estimation apparatus including a memory and a processor running a program configured to perform a method of calculating the amount of carbon generated during the life span of a structure, the method including the steps of displaying a graphical user interface ("GUI") stored in the memory of the apparatus which is configured to gather structural information pertaining to the structure, receiving structural information from the GUI into the memory of the apparatus which includes information pertaining to the size, types of material used in the structure and structural aspects of the structure, generating an estimated amount of carbon generated from the use of each type of material used in the structure and the labor used to construct the structure based on the structural information received by the processor, estimating the types and amounts of material and labor required to demolish all or a portion of the structure and to repair the structure after a destructive event that causes structural damage occurs based on a calculated probability and magnitude of a structural event occurring by the processor, generating an estimated amount of carbon resulting from the materials used and the labor required to repair the structure after a destructive event has occurred by the processor, and displaying the estimated amount of carbon generated during construction and for demolition and repair of the structure on a display unit.

In another embodiment consistent with the present invention, the estimation of carbon generated in the construction of the structure is based on the total reconstruction of the system.

In another embodiment consistent with the present invention, the estimation of carbon generated in the construction of the structure includes the amount of carbon generated by the manufacture of the material used in construction of the structure.

In another embodiment consistent with the present invention, the estimation of carbon generated in the construction of the structure includes the amount of carbon generated by machinery used in construction of the structure.

In another embodiment consistent with the present invention, the estimation of carbon generated in the demolition and repair of the structure after a destructive event includes the amount of carbon generated by the demolition of the damaged portions of the structure.

In another embodiment consistent with the present invention, the estimation of carbon generated in the demolition and repair of the structure after a destructive event includes the amount of carbon generated by the manufacture of the material used in the repair of the structure.

In another embodiment consistent with the present invention, the estimation of carbon generated in the to demolition and repair of the structure after a destructive event includes the amount of carbon generated by machinery used in demolition and repair of the structure.

In another embodiment consistent with the present invention, the estimation of the type and amount of material required to demolish all or a portion of the structure and to repair the structure after a destructive event includes the step of varying the amount of damage based on a seismic load-resisting system installed on the structure.

In another embodiment consistent with the present invention, the estimation of the type and amount of material required to demolish all or a portion of the structure and to repair the structure after a destructive event includes the step of varying the amount of damage based on a wind load-resisting system installed on the structure.

In another embodiment consistent with the present invention, the program queries a structural component database resident in the memory of the apparatus to determine the amount of material used in the construction of the structure based on the information pertaining to the design of the structure.

In another embodiment consistent with the present invention, the program queries a structural component database resident in the memory of the apparatus to determine the amount of material used in the repair of the structure based on the information pertaining to the design of the structure.

In another embodiment consistent with the present invention, an emission estimation system includes a graphical user interface stored in the memory of the apparatus which is configured to gather information pertaining to the characteristics of a structure, a structural information receiving unit which receives structural information from the graphical user interface which includes information pertaining to the size, types of material used in the structure and structural aspects of the structure, a carbon estimation unit configured to estimate the amount of carbon generated from the use of each type of material used in the structure and the labor used to construct the structure based on the structural information received, a repair estimation unit configured to estimate the types and amounts of material and labor required to repair the structure after a seismic event occurs and to calculate a probability and magnitude of a structural event occurring and to estimate an amount of carbon resulting from the materials used and the labor required to repair the structure after the seismic event, and a display unit configured to display the estimated amount of carbon generated during construction and repair of the structure.

Other systems, methods, features, and advantages of the present invention will be or will become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The accompanying drawings, which are incorporated in and constitute a part of this specification, illustrate an implementation of the present invention and, together with the description, serve to explain the advantages and principles of the invention. In the drawings:

FIGS. 3A, 3B and 3C each depict a flow diagram illustrating exemplary steps by the structure carbon footprint analysis tool for estimating the carbon emitted during the construction of a structure and for any repairs due to a destructive event for use with the methods and systems consistent with the present invention.

FIG. 4 depicts a flow diagram illustrating exemplary steps by the structural carbon footprint analysis tool for estimating the amount of material used in the construction of a structure for use with the methods and systems consistent with the present invention.

DETAILED DESCRIPTION OF THE INVENTION

While various embodiments of the present invention are described herein, it will be apparent to those of skill in the art that many more embodiments and implementations are possible that are within the scope of this invention. Accordingly, the present invention is not to be restricted except in light of the attached claims and their equivalents.

Described herein is an environmental analysis tool that is utilized to calculate the carbon footprint of structures. This tool predicts the advantages of reducing carbon emissions through the use of advanced structural systems used to reduce damage during natural or man-made events occurring during the life of the structure. It is generally believed that carbon emissions contribute to global warming and that the most sustainable structures are those that perform well over their service life.

The tool calculates the carbon footprint associated with initial construction considering material type including any mining, harvesting, processing or other fabrication methods, transportation of materials, and the construction of such materials. The tool predicts the carbon footprint associated with the structure throughout its service life considering exposure to the environment including wind, seismic, and other loadings particularly associated with the structure's site location. The calculator considers the effects of enhanced structural systems in regions of high risk due to seismicity, adverse wind conditions, or man-made threats and evaluates the advantages of such systems in reducing carbon emissions. In the event of damage caused by such events, the calculator predicts the carbon footprint associated with the removal, repair, and reconstruction of damaged structural elements. If damage is extreme, the calculator predicts the complete demolition and reconstruction of the structure.

The tool is capable of considering the carbon footprint of structures early in design where only limited parameters such as structure height, size, material type, and location are known. The carbon footprint is calculated by referencing a comprehensive database of built structures where material quantities relative to height of the structure and loading conditions are recorded. Parameters that are more specific may be used as input when design is refined including the evaluation of as-built structures.

Herein, the term "destructive event" is meant to include all man-made and natural destructive events, including, but not limited to, earthquakes, storms, hurricanes, tornadoes, high winds, terrorist attacks, explosions and any other man-made or natural destructive event which may damage a structure.

Figure 1:
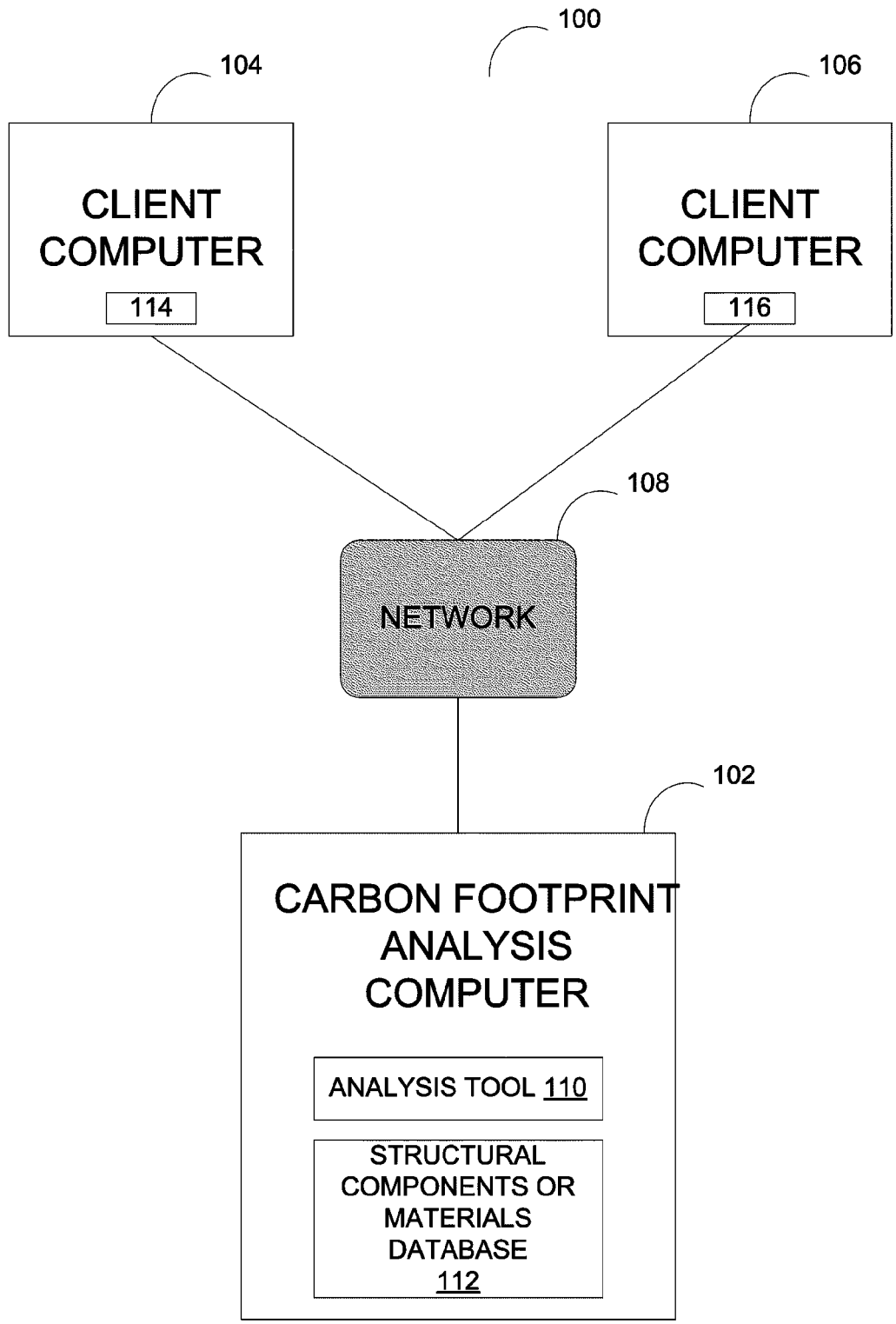
FIG. 1 depicts a block diagram of a data processing system or carbon footprint analysis system 100 suitable for use with the methods and systems consistent with the present invention.

FIG. 1 depicts a block diagram of a data processing system or carbon footprint analysis system 100 suitable for use with the methods and systems consistent with the present invention. The data processing system 100 comprises a plurality of computers 102, 104 and 106 connected via a network 108. The network is of a type that is suitable for connecting the computers for communication, such as a circuit-switched network or a packet-switched network. Also, the network may include a number of different networks, such as a local area network, a wide area network such as the Internet, telephone networks including telephone networks with dedicated communication links, connection-less network, and wireless networks. In the illustrative example shown in FIG. 1, the network is the Internet. Each of the computers shown in FIG. 1 is connected to the network via a suitable communication link, such as a dedicated communication line or a wireless communication link.

In an illustrative example, computer 102 serves as a structure carbon footprint analysis unit 110, which is effective to estimate the amount of carbon emitted during the service life of a structure. As will be described in more detail below, computer 102 includes a carbon footprint analysis tool ("CFAT") 110 for structures that gathers information on a structure design and generates an estimate of the amount of carbon emitted in the construction and subsequent demolition and repair of the structure after a destructive event, as well as, a structural components database 112, which stores historical construction data for previously designed and constructed structures. The number of computers and the network configuration shown in FIG. 1 are merely an illustrative example. One having skill in the art will appreciate that the data processing system may include a different number of computers and networks. For example, computer 102 may include the structure carbon footprint analysis program as well as one or more of the analysis programs. Further, the administrator program may reside on a different computer than computer 102.

Figure 2:
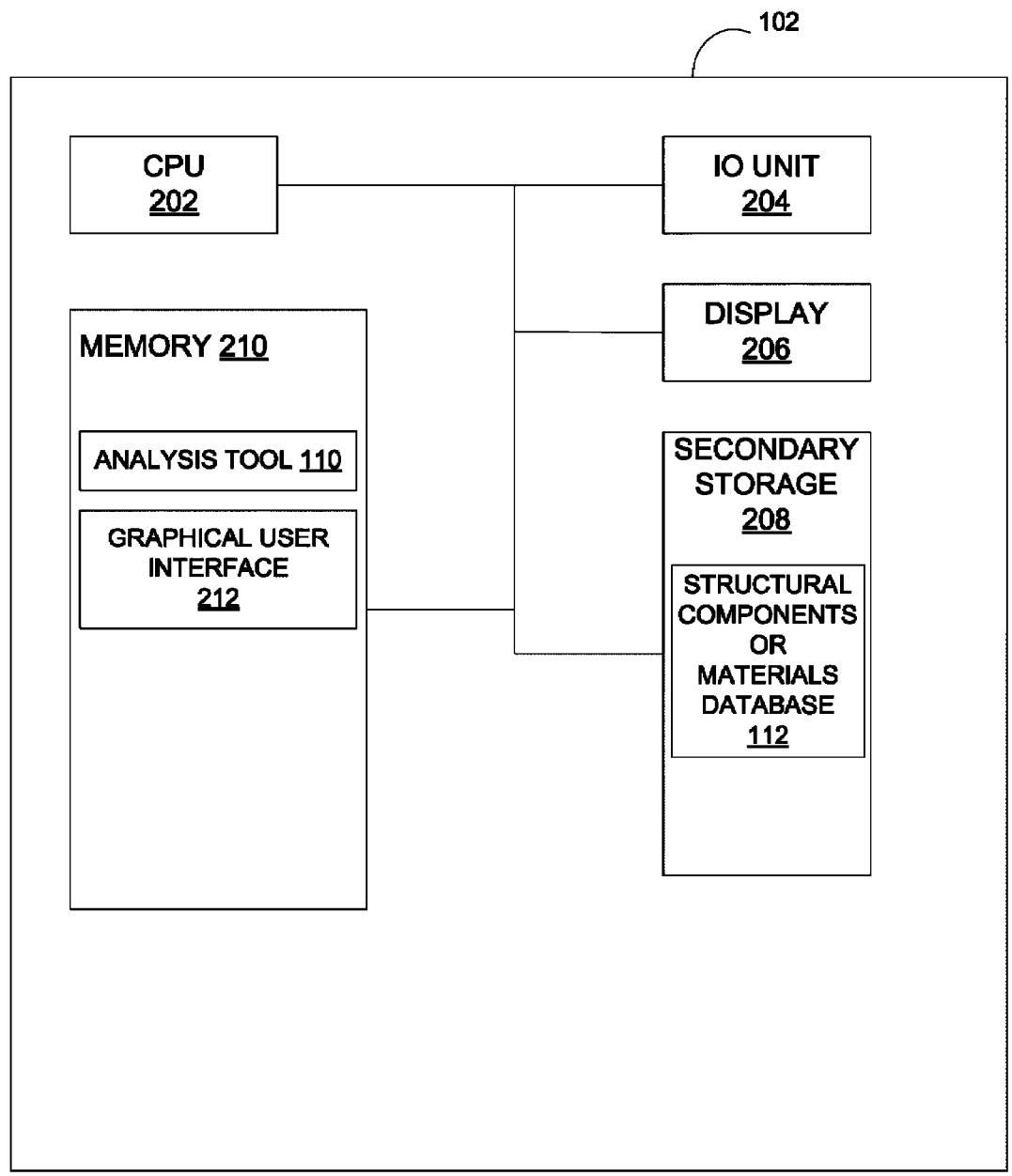
FIG. 2 shows a more detailed depiction of a computer used in the data processing system for use with the methods and systems consistent with the present invention.

FIG. 2 shows a more detailed depiction of computer 102. Computer 102 comprises a central processing unit (CPU) 202, an input output (I/O) unit 204, a display device 206, a secondary storage device 208, and a memory 210. Computer 102 may further comprise standard input devices such as a keyboard, a mouse, a digitizer, or a speech processing means (each not illustrated).

Computer 102's memory 210 includes the CFAT 110 which is configured to create an estimate of the amount of carbon generated during the construction of a structure and in the repair of damage due to a destructive event and a GUI 212 which is used to gather information from a user via the display device 206 and I/O unit 204 as described herein. The secondary storage device 208 includes a structural component database 112, which stores historical construction data. Further, the CFAT 110 and GUI 212 may also be stored in the secondary storage unit 208.

The CFAT 110 will be described in more detail below.

In the illustrative example, the CFAT 110 is a stand-alone program that communicates with the GUI 212 and the structural component database 112. In another embodiment, the CFAT 110 may be a plug-in or component of another program.

Figure 3A:
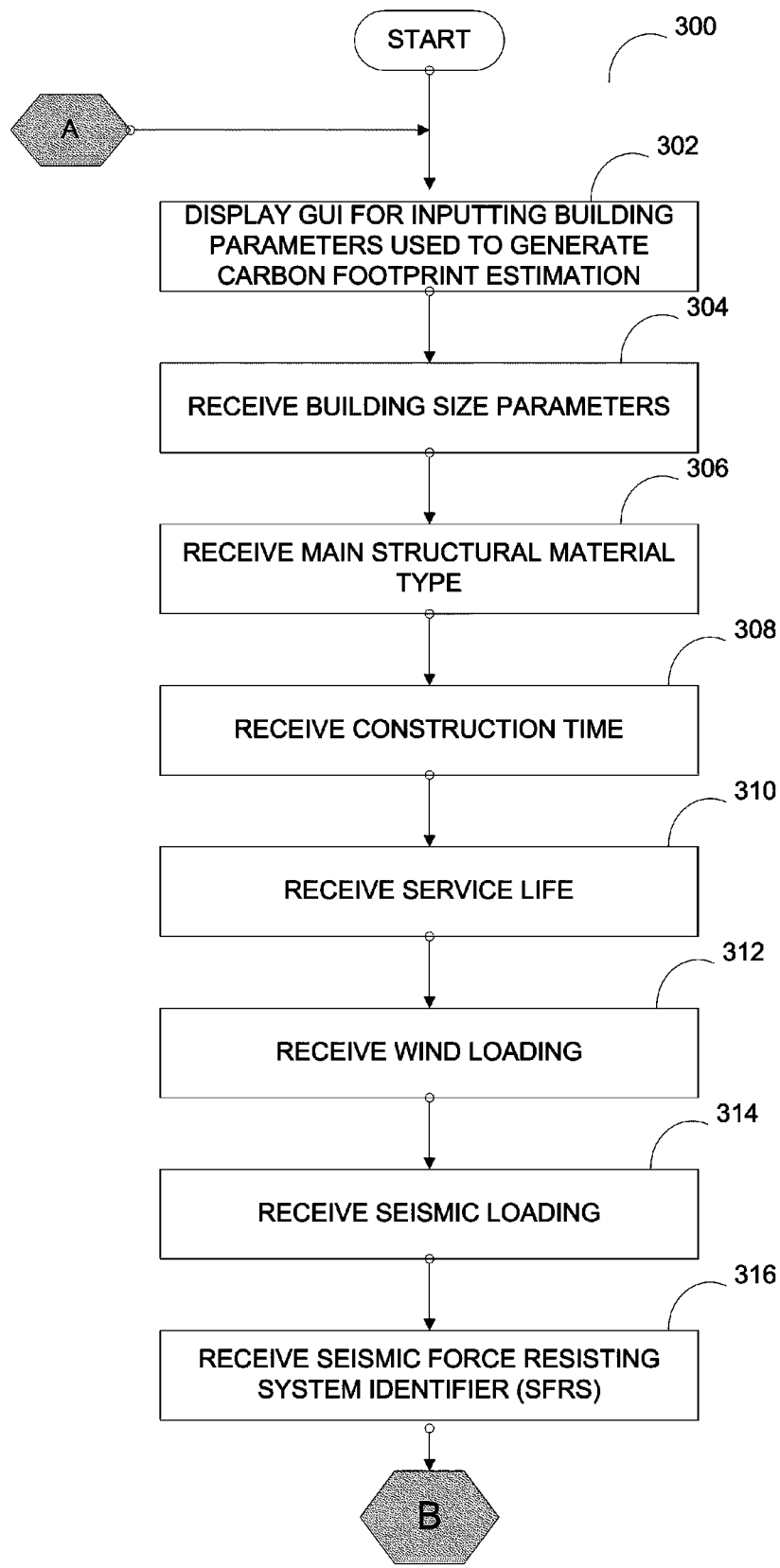
Figure 3B:
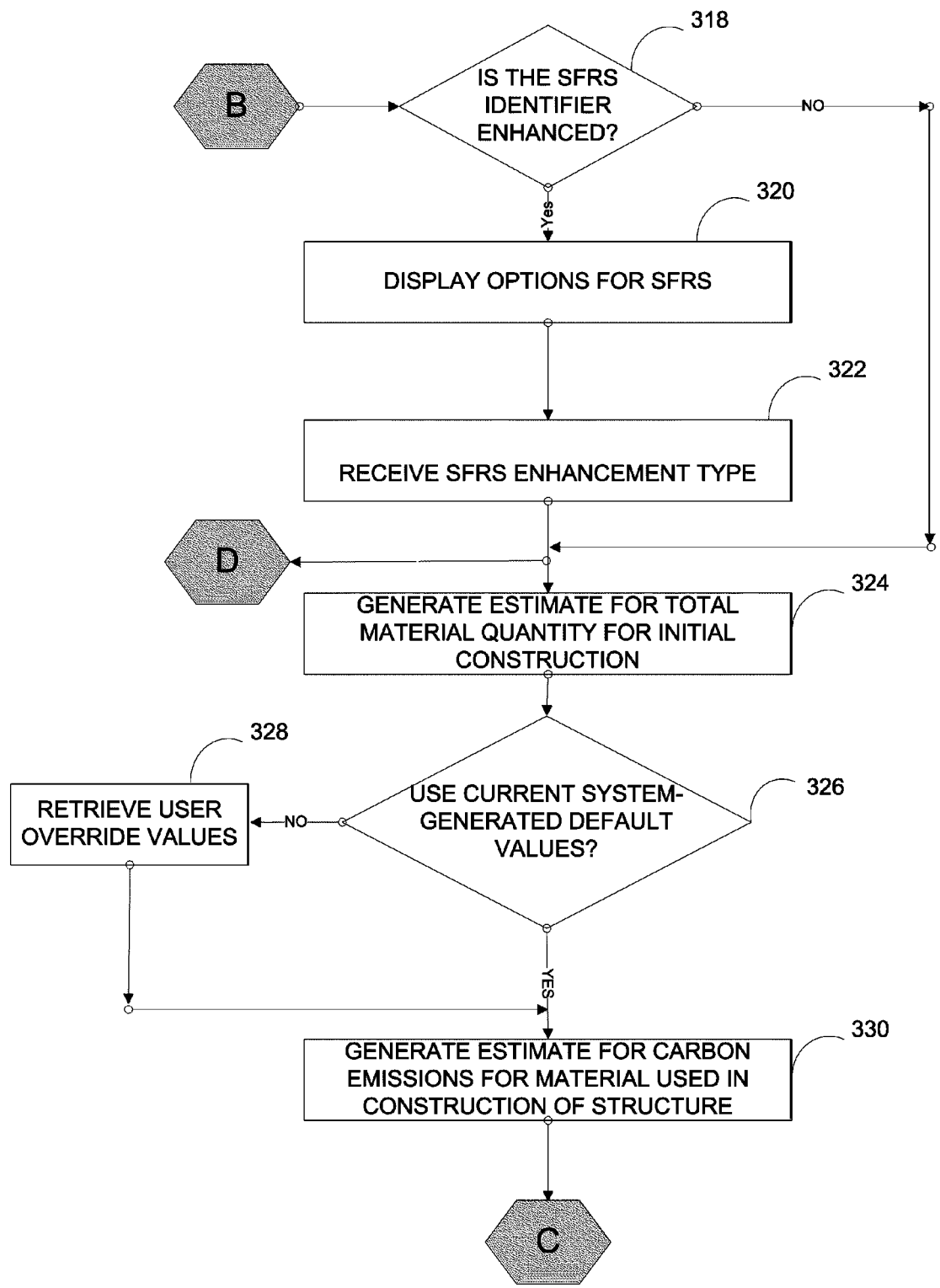

FIGS. 3A-3C depict a flow diagram 300 illustrating exemplary steps by the CFAT 110 for estimating the carbon emitted during the construction of a structure and for any repairs resulting from a destructive event. First, in step 302, the CFAT 110 displays a user input screen, via the GUI 212, which includes a plurality of user input objects, which are effective to gather parameters used to generate an estimate of the carbon footprint of a structure. The parameters gathered include, but are not limited to, the number of stories in the structure, the material used to build the structure, the expected seismic loading and wind loading on the structure and any other parameter indicative of the size of the structure, the material used in the structure or the seismic force-resisting system used in the structure.

In step 304, the CFAT 110, receives the size parameters of the structure via a user input object on the GUI 212. The size parameters may include, but are not limited to, the number of stories of the structure, the total floor area above the ground, also called the superstructure, or any other indicator of the size or dimension of the structure including foundations and substructures located below ground level. In an illustrative example, the CFAT 110 may display user input objects on the GUI for entry of the number of floors of a structure and the average floor area per floor of the structure.

In step 306 the CFAT 110, displays a user input object, which receives each of the main structural materials used to make the structure from the GUI 212. The main structural material type may include, but is not limited to, steel, concrete, composite (such as a combination of steel and concrete), wood or any other applicable material.

In step 308, the CFAT 110 displays a user input object that receives the time required to construct the structure from the GUI 212. In one embodiment consistent with the present invention, the construction may be represented as the estimated duration of construction per floor. In another embodiment, the duration may be represented by the total duration to construct the structure.

In step 310, the CFAT 110, displays a user input object that receives the expected service life of the structure. The service life represents the number of years the structure is expected to be used and in service. In one embodiment consistent with the present invention, the expected service life is set to a default value of 50 years, which represents a common value for a structure service life, but actual design service lives vary by geography, function, owner, and other factors. In another embodiment, the structure service life is set to a default value of 100 years or greater.

In step 312, the CFAT 110, displays a user input object that receives the expected wind loading on the structure. In one embodiment consistent with the present invention, the wind loading may be classified into levels including, but not limited to, low, moderate, and high. Each of the categories corresponds to a range of values for 3-second gust basic wind speed. The division of each range is determined using statistical methods based on proportioning by magnitude and abundance of occurrence as listed by the 2006 International Building Code ("IBC"). The categories may be assigned as follows:

| Wind Loading Level | 3-second Gust Basic Wind Speed, V |
|---|---|
| Low | <45 m/s |
| Moderate | 45 to 58 m/s |
| High | >58 m/s |

Generally, these divisions yield geographical classifications in line with common perceptions. Areas that are inland and far from hurricane regions, such the western region of the United States, are mainly classified as "low"; those inland but closer to coasts prone to hurricane winds are "moderate"; and those on coasts that experience frequent hurricane force winds are "high". In another embodiment consistent with the present invention, the wind loading may be a numerical value.

In step 314, the CFAT 110, displays a user input object that receives the expected seismic loading on the structure. In one embodiment consistent with the present invention, seismic loading may be classified as including, but not being limited to, one of the following levels: no loading, low, moderate, and high. The minimum level of seismic loading for determining material quantities is "low"; a value of "none" for seismic loading is used to assign zero probabilistic damage.

Each of the three categories may correspond to a range of values for spectral response acceleration, Ss, in terms of percentage of gravity, g as given by the IBC. The division of each range may be determined using statistical methods based on proportioning by magnitude and abundance of occurrence. The categories may be assigned as follows:

| Seismic Loading Level | Spectral Response Acceleration, Ss |
|---|---|
| Low | <0.38 g |
| Moderate | 0.38 g to 0.95 g |
| High | >0.95 g |

Generally, these divisions yield geographical classifications in line with common perceptions. Areas that are far from active fault zones, like in the eastern region of the United States, are mainly classified as "low"; those close to faults capable of producing medium-sized tremor are classified as "moderate"; and those near highly active faults capable of producing large earthquakes are classified as "high". In another embodiment consistent with the present invention, the seismic loading is represented by a numeric value representing the estimated spectral response acceleration.

In step 316, the CFAT 110, displays a user input object that receives the seismic force-resisting ("SFRS") identifier. In one embodiment consistent with the present invention, the SFRS identifier may be classified as "conventional" or "enhanced." In this embodiment, enhanced structural systems for resisting seismic loads are considered for the estimation of probabilistic damage factored over a structure's service life. Enhanced seismic force-resisting systems include, but are not limited to, stand-alone components usually supplied by manufacturers specializing in their production and installation. Seismic force-resisting systems may include, but are not limited to, conventional systems such as buckling-restrained braced frames (BRBFs), viscous dampers, self-centering mechanisms, pin-fuses, and base isolation units. These systems may be used in place of or in tandem with conventional systems like concentric braced frames, special moment frames, and special shear walls.

In step 318, the CFAT 110 determines if the SFRS identifier is set to "enhanced system." If the system is categorized as "enhanced," the CFAT 110, via the GUI 212, prompts the user to select the type of enhanced seismic force-resisting system that relates to the performance of the structure and the expected damage resulting from a seismic event. The rating of expected destructive events may include, but are not limited to, zero damage, base isolation, pin fuse, link fuse, viscous dampers, unbonded PT, shear wall, braced frame, BRBFs, conventional, or any other applicable rating of indicative of an expected destructive event. If the SFRS is not set to "enhanced" the CFAT 110 moves to step 324.

In step 320, the CFAT 110 displays a user input object indicating the performance level for a typical or design earthquake. In one embodiment consistent with the present invention, the expected structure performance level, by default, may be chosen to be "Life-Safe." Life-Safe is a common design goal for structures as recognized by building codes, due to their occupancy categories and importance factors. This performance level implies that a structure is expected to still be standing directly after an event but probably not be suitable for re-occupancy without major reconstruction efforts and disturbance to the operations occurring inside the structure.

The performance level may also include, but is not limited to, "fully operational" (often assigned to critical infrastructure and essential facilities that should have minimal damage and no interruption to operations occurring inside the structure), "operational" (for structures expected to be mostly occupied directly after an event without reconstruction but with some damage), and "near collapse" (for low-occupancy, low-importance structures that would be expected to still be standing directly after an event but not suitable for any re-occupancy in the future). In step 322, the CFAT 110 receives the SFRS enhancement type.

In step 324, the CFAT 110 estimates the amount of material used to construct the structure. In one embodiment consistent with the present invention, the CFAT 110 estimates the amount of each material used to build the structure, which include, but are not limited to, steel, concrete, composite (such as a combination of steel and concrete), wood and any other material used for constructing a structure. This estimation of the material quantity will be discussed later in the specification.

In step 326, the CFAT 110 determines if the system generated default values should be used to determine the amount of carbon generated during the life span of the structure. In an illustrative example, the CFAT 110 may prompt the user to determine if the user wants to use the system generated default values to estimate the carbon emissions generated by the construction, demolition and repair of the structure. If the system generated default values are used, the CFAT 100 moves to step 330. If user override values are not used, the CFAT 110 moves to step 328.

In step 328, the CFAT 110 retrieves the user override values and then proceeds to step 330. In one embodiment consistent with the present invention, the user override values are gathered by the CFAT 110 from the user. In another embodiment consistent with the present invention, the CFAT 110 gathers the user override values from a database or other data storage device including, but not limited to, a web site, a file, a scanned document or any other mechanism which is capable of storing data digitally.

In step 330, the CFAT 110 estimates the emissions generated by the materials used in the construction of the building including the emissions generated by the manufacturing of each of the materials used in constructing the structure based on the material information gathered in step 310. The CFAT 110 estimates the emissions totaled over the entire time spent from initial manufacturing of materials to the completion of the structure, with additional regard for material replacement after damage or reconstruction. It is effectively a life cycle assessment (LCA) tool based on data taken from several different life cycle inventories (LCI) created for all the different manufacturing, fabrication, transportation, construction, and demolition processes that occur in this time-frame.

There are innumerable quantities that may be listed as prerequisites to the completion of a specific production process, and each may be categorized as either an "economic flow" or "environmental flow". Economic flows, in simplest terms, encompass items that are created specifically for the construction of the structure.

Environmental flows encompass items that are not created specifically for the construction of the structure, so their embodied energies are not included in the sum of emissions. For example, for the installation of a structural material into a structure, the use of fuel that this process requires for the running of specific machines it uses is considered to be an economic flow, since the emissions associated with using it are included in the calculation. The source of the fuel itself, on the other hand, is considered to be an environmental flow, since the embodied energy of the production of this fuel is not included (this embodied energy might include emissions resulting from the distance the fuel is carried from its source, its method of refinement, or the construction of its own infrastructure).

In general, since fuel and energy are common, their use is considered to be an economic flow that is supplied by the user while their sources are considered to be environmental flows—in other words, there is an account of how much fuel and energy is used but the is no account for how the fuel and energy are created. Thus, the emissions terms associated with burning diesel fuel or using electricity from the grid are included, but those with obtaining the fossil fuels used for diesel fuel and energy, manufacturing oil rigs, constructing and operating refineries and power plants, and transporting this fuel and energy through tankers, pipelines, and gas stations are not included. However, the delivery of diesel fuel and transmission of energy from storage to industrial equipment is included due to the nature of the data used.

In one embodiment consistent with the present invention, the CFAT 110 goes back as far as the mining and extraction of raw materials used in the manufacturing of each of the materials, so the energy and fuel used in these processes are included using emissions information provided by the National Renewable Energy Laboratory database ("NREL") (available from the National Renewable Energy Laboratory National Renewable Energy Laboratory 1617 Cole Blvd. Golden, Colo. 80401-3305) which provides the amount of emissions generated from the mining and extraction of raw materials.

These raw materials may be cleaned or processed just after extraction. The transportation of these raw materials and any processed materials to a central site where they are combined to form a structural material is included in this step for fuel consumption. The manufacturing terms of the machines and tools required for the processes in this step, such as excavation tools, rails, power plants, and truck engines, are not themselves included, as they are considered to be reusable items that are not specifically associated with the structure. The uses of energy and fuel in these machines are considered to be economic flows and their emissions are also taken from the NREL.

In an illustrative example, for structural steel, the finished structural material is considered to be steel alloy and its production is an economic flow through the use of energy and water, oils, the steel alloy is created by joining pig iron with iron scrap and other metals and as a result carbon dioxide and other gases are emitted to the air in addition to waste heat, water, dust, oils and other gases and minerals not calculated as they do not contribute to the GWP. The production of the pig iron itself is an economic flow, as it is created by using energy and water to join pellets, sinter, and limestone and as a result there are emitted outputs.

The production of pellets is an economic flow involving bentonite and iron ore, and the production of sinter is too, involving coke, lime and iron ore. Even iron ore is produced in an economic flow, as energy and water are used to refine raw iron ore resources. The raw iron ore resource is considered to be an environmental flow. The emissions from all the economic flows are summed to determine a single emission for the production of steel alloy.

In another illustrative example, concerning concrete, the finished structural material is considered to be a concrete batch and its production is an economic flow: energy and water are used to join Portland cement, gravel and sand aggregate, slag, fly ash, and small amounts of steel and synthetic rubber and as a result there are emitted outputs. The production of the Portland cement is an economic flow, as it is created by using energy and water to join gypsum and clinker. Gypsum is produced in an economic flow by refining raw gypsum resource, which is itself an environmental flow. Clinker is produced in an economic flow involving lime, limestone, clay, bauxite, sand, and coke. Gravel and sand aggregate are produced in an economic flow by refining and crushing gravel resource in the ground, which is itself an environmental flow. Slag and fly ash are produced and transported in economic flows from their points of origin. The emissions from all the economic flows are summed to determine a single emission for the production of the concrete batch.

In another embodiment consistent with the present invention, for any fabrication that occurs after material manufacturing, such as steel finishes or concrete mixing, the CFAT 110 may account for fuel consumption during the delivery of structural materials from manufacturing plant to fabrication plant, as well as fuel and energy consumption during the fabrication processes, such as running an electric saw or mixing tank using values provided by the NREL. The energy terms used for the manufacturing of this equipment are not included as they are considered as reusable items that are not specifically associated with the structure.

In step 332, the CFAT 110 estimates the emissions resulting from the construction of the structure including the delivery of materials and laborers to and from the construction site and the emissions from the operation of any equipment used in the construction of the structure. In one embodiment consistent with the present invention, the CFAT 110 may account for fuel consumption during the delivery of structural materials from fabrication plant to site only using emissions values provided by the NREL or the South Coast Air Quality Management District database ("SCAQMD") (available from South Coast Air Quality Management District 21865 Copley Dr., Diamond Bar Calif. 91765.) The manufacturing of the engines, chassis and other machinery for each mode of transportation are not themselves included, as they are considered to be reusable items that are not specifically associated with the structure.

For transportation terms associated with construction activities—namely, commuting of laborers, delivery of support items, and delivery of heavy support items—emissions due to fuel consumption using specific modes of transportation are included in terms of distance traveled only. This differs from the method of computing emissions for the transportation of structural materials to site, which utilizes units of weight multiplied by distance because of the size of the vehicles used and nature of how the materials are stored en route, which is not comparable to passengers sitting in a car or light materials resting on the bed of a pickup truck.

In one embodiment consistent with the present invention, the CFAT 110 may encompass the commuting of laborers to site, delivery of support items to site, and all production processes relating to the installation of the structural materials during construction and for any repairs resulting from a destructive event. Energy terms used for the production and maintenance of everyday support items for laborers, such as food, protective clothing, and restrooms, are not included as they are considered reusable items that are not specifically associated with the structure. For commuting and delivery, as described above, only fuel consumption is included and it is considered an economic flow. Likewise, for the production processes of construction, only fuel and energy consumption are included—the energy terms used for such items as the manufacturing and transportation to site of cranes, welding machines, impact wrenches, and formwork are not included as they are considered to be reusable items that are not specifically associated with the structure.

Some laborers on site for construction commute to the site from their homes on a daily basis using their own personal, passenger vehicle. Although commuting to work is an accepted aspect of modern society that is not dependent on the nature of the specific structure itself (like preparing food, providing clothing, and maintaining restrooms, which are not included in the construction stage, for example), this process term is included because the project site is not related to where the laborers commute. In one embodiment consistent with the present invention, the default weight of passenger vehicles is set to a default value of less than or equal to 8500 lb (3855 kg).

In another embodiment consistent with the present invention, the construction delivery term may be split into two terms: ordinary deliveries and heavy deliveries. Ordinary deliveries require the use of small delivery trucks on a nominal daily basis and include lightweight supplies that are required on site for support of the construction of the structure such as worktables, handheld equipment, electrical cords, lighting, and tools like rakes, shovels, and dowels. In one embodiment consistent with the present invention, small delivery trucks are set to weigh a default value of between 8500 and 33000 lb (3855 to 14970 kg). In yet another embodiment, heavy deliveries require the use of heavy-heavy duty trucks on a nominal daily basis and include larger supplies such as cribbing, bracing and shoring members, and stand-alone equipment. Heavy-heavy duty trucks are set to weigh a default value between 33001 and 60000 lb (14970 to 27215 kg). The transportation of large construction equipment, like cranes and forklifts, are included in this term as well.

In another embodiment consistent with the present invention, the amount of diesel fuel may be included in the emissions generated during construction based on values provided by the NREL or the SCAQMD. Diesel fuel is used to power many different types of industrial equipment and machinery used for construction processes. In addition to emissions that occur during combustion while using the powered equipment, total life-cycle assessment accounts for some upstream profile, namely, the average transportation needed to move the diesel fuel from a refinery to the piece of equipment where it is being used based on information provided by NREL or SCAQMD.

If diesel fuel is not used to power equipment used in the demolition processes included in the calculator, then power may be provided in the form of electricity. For each electric process, a power demand in terms of Mega-joule per hour corresponds to a unit CO2e emission per unit time.

In step 334, the CFAT 110 determines the probable damage to the structure resulting from a destructive event. In an illustrative example, the CFAT may determine the probable damage occurring from a seismic event. The system may estimate the probable occurrence of a seismic event occurring by using default or basic earthquake values chosen to be a 475-year earthquake, referred to as the "rare" event, which has a return period of 475 years, equivalent to a 10% chance of occurring every 50 years. In another illustrative example, the design earthquake may also include, but is not limited to, the 43-year "frequent" earthquake, the 72-year "occasional" earthquake, and the 2475-year "very rare" earthquake, otherwise known as the "maximum considered earthquake" in many design codes.

To determine the probable amount of damage to the structure from a destructive event, the CFAT 110, may use the following equation:

$$\text{Total Damage} = \text{Service Life} \times \text{Annual Probability of Event Occurring} \times SFRS \text{ Enhancement Level}$$

System Factor is based on the performance type gathered in step 320.

In step 336, the CFAT 110 determines the emissions generated by the labor, machinery operation and transportation costs associated with the demolition of the portions of the structure damaged by the destructive event using information provided by the NREL. In one embodiment consistent with the present invention, the CFAT 110 uses the same methodology discussed above to determine the amount of labor, machinery operation and transportation cost required to demolish the damaged portions of the structure by a destructive event.

The emissions associated with the demolition of a structure vary by structure type, size, material, and intended use of demolished materials. The demolition of portions of structural steel structures requires different equipment types and use durations from the demolition of a reinforced concrete structure. At the same time, for a structural steel structure on its own, equipment types and use durations vary depending on whether demolished framing elements are intended to be recycled or reused (the difference being that reused elements are removed intact so that they may be installed elsewhere in their current forms with minor alterations, while recycled elements are removed in pieces and broken down into smaller forms to be molded into new elements). The same holds true for reinforced concrete, composite, wood, masonry, light gage steel structures and the like.

Equipment types commonly found on a demolition site may include, but is not limited to, trucks, air compressors, lifting machines with multiple attachments (like a hammer, bucket, or crusher jaws), saws, impact wrenches, excavators, grinders, forklifts, and cranes. Demolition processes include: pulling members from the structure, cutting members, loading cut pieces onto trucks, transporting materials around site, cutting rebar, chipping, and removing bolts. The emissions generated by each of these pieces of equipment are taken from the NREL.

In one embodiment consistent with the present invention. The transportation of materials off the site using weight multiplied by distance is considered but the use of the material when offsite is not considered. Materials may be transported to dump sites, landfills, other project sites, steel or concrete batch plants, or kept for reuse on site. Also, the structural assemblies are not specifically designed for demolition, disassembly, or reuse.

In one embodiment consistent with the present invention, the data for demolition uses energy intensities in terms of Mega-joules per area of demolition for both recycle and reuse cases of baseline structural steel and reinforced concrete structures. An average value is determined for each structure type and based on data from the NREL.

In another embodiment consistent with the present invention, the amount of diesel fuel may be included in the emissions generated during demolition based on values provided by the NREL or the SCAQMD. Diesel fuel is used to power many different types of industrial equipment and machinery used for demolition processes. In addition to emissions that occur during combustion while using the powered equipment, total life-cycle assessment accounts for some upstream profile, namely, the average transportation needed to move the diesel fuel from a refinery to the piece of equipment where it is being used based on information provided by NREL or SCAQMD.

If diesel fuel is not used to power equipment used in the demolition processes included in the calculator, then power may be provided in the form of electricity. For each electric process, a power demand in terms of Mega-joule per hour corresponds to a unit CO2e emission per unit time.

In step 338, the CFAT 110 estimates the amount of materials required to repair the damages to the structure from a destructive event. The CFAT 110 estimates the amount of each material used in the construction of the structure required to repair the probable damage that would occur to the structure based on the structure's parameters, which were previously gathered by the user input objects. To perform this calculation, the CFAT 110 uses the previously estimated probability of a destructive event occurring, the estimated amount of damage resulting from the destructive event and then uses historical data stored in the structural component database 112 to determine the amount of material and labor required repair the damage.

The demolition and reconstruction processes are included to capture effects of probabilistic damage expected over the service life of the structure due to seismicity, which may be minimized through thoughtful design. Reconstruction consists of material replacement and reinstallation, the emissions from which are taken to be equal to the initial values (adjustment for time lapse is not considered). In one embodiment consistent with the present invention, the CFAT 110 determines the total area of the structure, which would require demolition and repair after a destructive event. The amount of material required to repair the damage is taken as a function of the area damaged by the destructive event. In an illustrative example, the amount of material may be calculated based on total destruction of the structure which would require full demolition and reconstruction of the structure.

In step 340, the carbon emissions generated due to the material used to repair the predicted damage resulting from a destructive event are estimated. In one embodiment consistent with the present invention, the CFAT 110 may estimate the amount and types of material used to repair the predicted damage resulting from a destructive event in the same manner as step 324.

In step 342, the CFAT 110 estimates the emissions generated by the labor, machinery operation and transportation costs associated with the repair of damages to the structure due to a probable destructive event. In one embodiment consistent with the present invention, the CFAT 110 uses the same methodology discussed above to determine the amount of labor, machinery operation and transportation cost required to repair damage to the structure by a destructive event.

In step 344, the CFAT 110 displays the emissions estimates on the GUI 212 via the display 206. In one embodiment consistent with the present invention, the carbon emission information is displayed using a graph showing the percentage each component of the structure attributes to the total carbon emission.

In step 346, the CFAT 110 determines if the user would like to adjust any of the previously enter values. If the user would like to adjust the values, the process returns to step 302. If the user does would not like to adjust the previously entered values, the process ends.

Figure 5A:
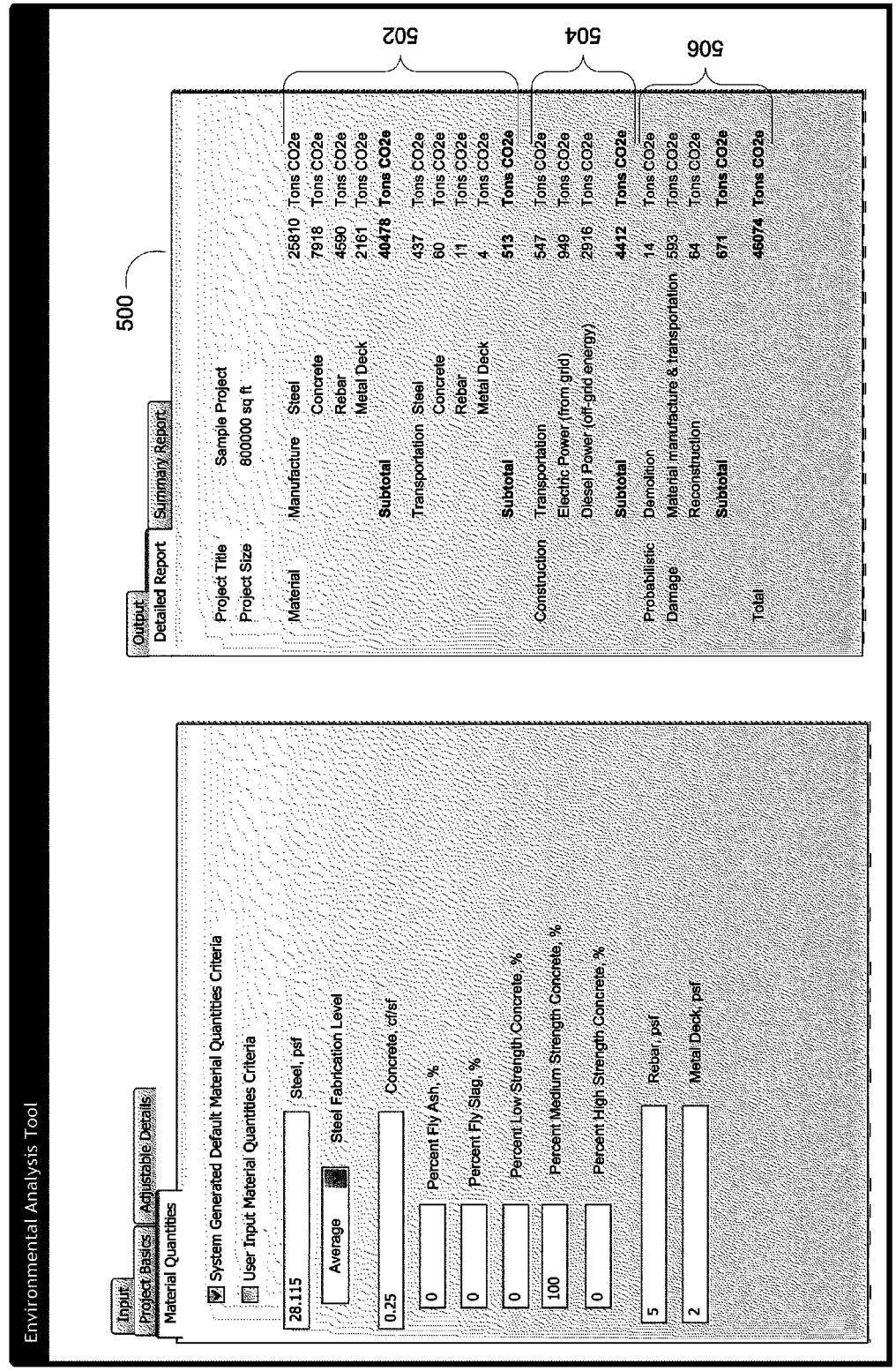
FIGS. 5A and 5B depict illustrative examples of the emissions estimate displayed on the graphical user interface which is consistent with the present invention.
Figure 5B:
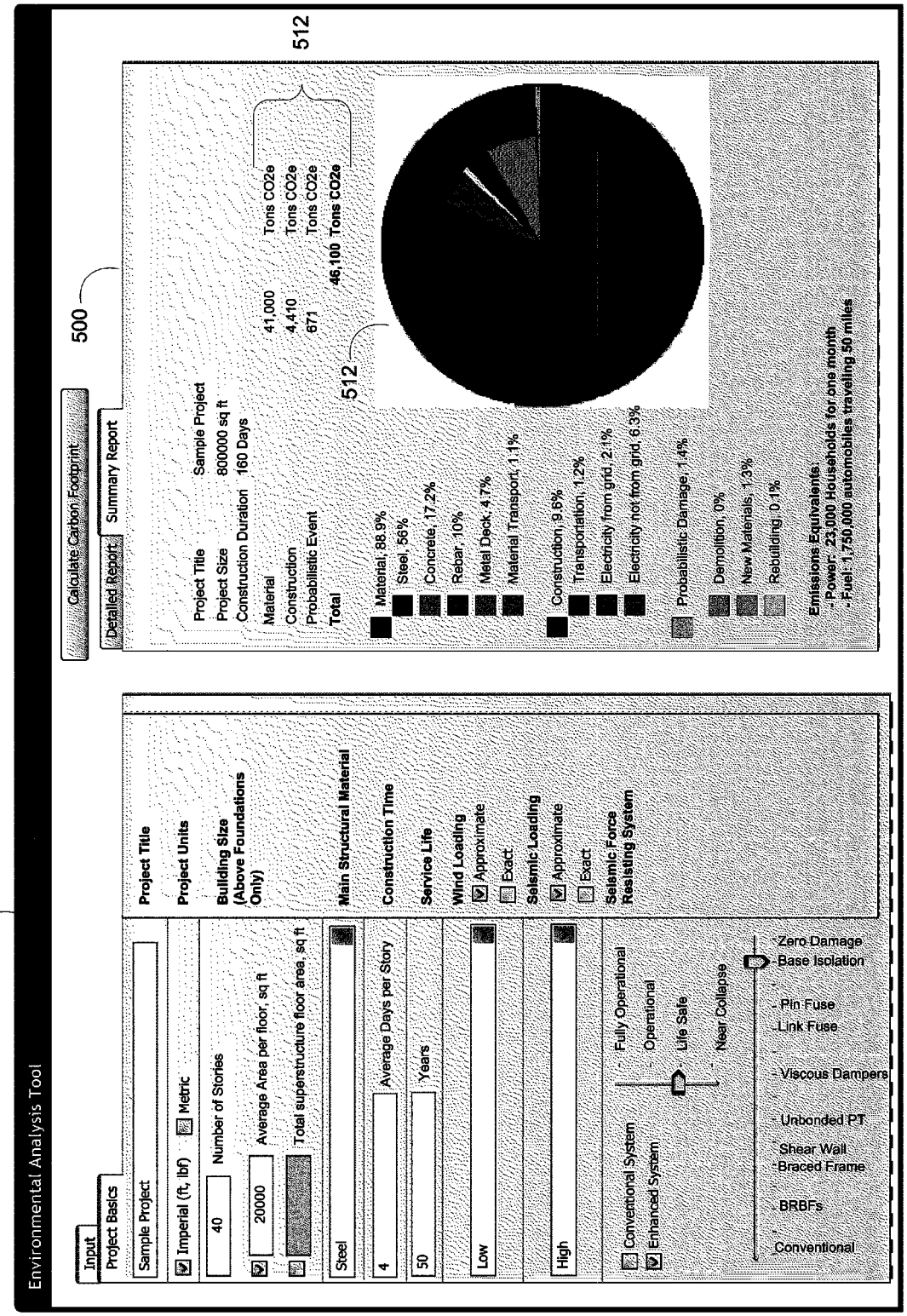

FIGS. 5A and 5B are illustrative examples of the emissions estimate displayed on the GUI 212. FIG. 5A depicts a detailed report of the carbon emissions generated by the construction and repair of the structure. The detailed report 500 may separate the carbon emissions based on material used in the construction of the structure 502, the carbon emissions generated by labor and machinery during initial construction 504, the carbon generated in the demolition and repair of damage due to a destructive event 506 and a total carbon emission for the life span of the structure 508.

The detailed report 500 may display each type of material used in the construction of the structure with the amount of carbon attributed to each of the types of material 502. In addition, the detailed report 500 may display the carbon generated by the fuel and electricity used in the initial construction of the structure 504 and the amount of carbon attributed to the demolition, material and reconstruction after a destructive event 506.

FIG. 5B is an illustrative example of a summary report 510 displayed on the GUI 212. The summary report 510 includes a summary area 512 that displays the total carbon generated by the material, construction and repair of the structure. In addition, the summary report 510 may include a graphical representation of the carbon emissions by the type of material, type of construction activity generating the carbon and the demolition, carbon generated by the reconstruction of the structure 514.

In another embodiment consistent with the present invention, the CFAT 110 displays a detailed report 500 showing the estimated amount of carbon emission attributed to each component of the system. In an illustrative example, the display may separate the carbon emissions into categories such as the carbon generated by the manufacture of each type of material used in the structure, the carbon generated by the transportation of the material and the carbon generated by the demolition and repair of the structure from a destructive event.

In step 340 of FIG. 3, the CFAT 110 determines if the user would like to adjust any of the values used to estimate the carbon footprint of the structure. If the user chooses to adjust a value, the CFAT 110 recalculates the carbon emissions based on the adjusted values or values.

In one embodiment consistent with the present invention, the CFAT 110 displays a cost benefit analysis on the display via the GUI. The cost-benefit analysis provides the user with a simplified method of assessing the return on investment and cost-benefit ratio of first cost to reduction in losses over the structure's service life by installing an enhanced SFRS. The analysis GUI is contained within a pop-up window containing a left side input and right side output (with run button titled "Generate Cost-Benefit") interface with tabs and sub-tabs similar to the main program interface.

In another embodiment consistent with the present invention, the CFAT 110 may display a plurality of tabs, as well as a button that the user presses to command the program to perform a cost-benefit calculation.

In an illustrative example, the first tab may be a summary tab, which contains useful information generated during the calculation of the carbon emissions. The tab may also contain several headings and analysis results for the enhanced system of a chosen first cost. Additional information displayed may include, but is not limited to:

Annual Return on Investment—displayed as percentage over structure service life

Mean Annual Losses—stated as average dollar savings per year vs. conventional system First Costs—repeated from user input Reduction in losses, 100-year event—displayed as dollar amount over service life Reduction in losses, 1000-year event—displayed as dollar amount over service life Benefit-Cost Ratio, 100-year event—displayed as decimal amount Benefit-Cost Ratio, 1000-year event—displayed as decimal amount In addition, the meaning of the benefit-cost ratio (B/C Ratio) may be explained with a legend:

B/C Ratio<1 means Loss

B/C Ratio=1 means Break-even

B/C Ratio>1 means Profit

In another embodiment consistent with the present invention, the CFAT 110 may display a tab showing information pertaining to the return on investment of different configurations. This tab may display more information related to the annual return on investment amount shown on the summary tab. The headings on this tab may include, but are not limited to:

Total expected annual loss for Building, Contents and Business Interruption—Conventional vs. Enhanced System Net Expected Annual Benefit—$ Net Additional First Cost—repeated from user input In yet another embodiment consistent with the present invention, the CFAT 110 may display more detailed information pertaining to the Benefit-to-Cost Ratio ("B/C Ratios") of the structure. The CFAT 110 may display information related to the B/C Ratios reported on the Summary tab for the 100- year and 1000-year seismic events, each given on a sub-tab. Each sub-tab may contain, but is not limited to, the following headings:

Cost of building component losses—Conventional vs. Enhanced System, $

Structural components—Conventional vs. Enhanced System, $

Non-structural components—Conventional vs. Enhanced System, $

Cost of Business Interruption—Conventional vs. Enhanced System, $

Total cost of building components losses and business interruption—Conventional vs. Enhanced System, $ Net Expected Benefit—$ Net Additional First Cost—repeated from user input Equivalent Benefit/Cost Ratio—displayed as decimal amount (same as on Summary tab)

In yet another embodiment consistent with the present invention, the CFAT 110 may display a detail of the total costs of structure components' losses (structural and nonstructural) and business interruption, net expected benefits, and equivalent benefit/cost ratios for all seismic events considered. The events considered include, but are not limited to 10% (1 in 10 yrs), 2% (1 in 50 yrs), 1% (1 in 100 yrs), 0.5% (1 in 200 yrs), 0.2% (1 in 500 yrs), 0.1% (1 in 1000 yrs), 0.04% (1 in 2500 yrs), and 0.01% (1 in 10000 yrs).

FIG. 4 depicts a flow diagram 400 illustrating exemplary steps by the CFAT 110 for estimating the amount of material used in the construction of a structure. In one embodiment consistent with the present invention, the structural component database 112 includes information pertaining to actual amounts of material used to construct structures based on wind loading and seismic loading values.

In step 402, the CFAT 110 retrieves the amount of material typically used for a structure at the inputted wind loading value as estimated by the CFAT 110. This value is indicative of the total amount of a specific type material required to resist the wind loading inputted into the CFAT 110 in step 312 of FIG. 3A based on the structure size parameters inputted in step 304 of FIG. 3A.

In step 404, the CFAT 110 retrieves the amount of material typically used for a structure at the inputted seismic loading value from the CFAT 110. This value is indicative of the total amount of a specific type material required to resist the seismic loading inputted into the CFAT 110 in step 314 of FIG. 3A based on the structure size parameters inputted in step 304 of FIG. 3A.

In step 406, the CFAT 110 compares the amount of material required to resist the desired winding and the amount of material required to sustain the desired seismic loading and determines which component requires more material. In step 408, the CFAT 110 uses the greater material amount to calculate the amount of carbon emissions generated by the manufacture and transport of the specific material.

In one embodiment consistent with the present invention, the information structural component database stores a plurality of data points indicative of the amount of material used in the construction of a structure based on the number of stories and the wind loading and seismic loading imposed on the structure. In this embodiment, the CFAT 110 queries the structural component database 112 for the data points associated with the inputted wind loading, seismic loading and structure size parameters. The structural component database 112 returns the approximated slope and the material intercept of a line containing the inputted wind loading and seismic loading based on the structure size parameter.

The CFAT 110 then uses the following equation to calculate the amount of each material that is used in construction of the structure:

$$Q_j = M_i \times N_{st} + B_i$$

Where $Q_j$ is the total amount material for each type of material used, $M_i$ is the slope of a line containing the wind or seismic loading values for each type of material used, $N_{st}$ is the number of stories entered in step 304 of FIG. 3A and $B_i$ is the line intercept for each type of material used. The CFAT 110 retrieves the slope and intercept for each type of material entered in Step 306 of FIG. 3A and calculates the amount of material used for based on the equation above for both the wind loading and seismic loading entered in Steps 312 and 314 of FIG. 3A.

In another embodiment consistent with the present invention, the CFAT 110 may determine the amount of each component used to make the concrete required construct a structure having the desired wind and seismic loading gathered in steps 312 and 314 of FIG. 3A. In this embodiment, the CFAT 110 queries the structural component database 112 for the data points associated with the inputted wind loading, seismic loading and structure size parameters. The structural component database 112 returns the approximated slope and the material intercept of a line containing the inputted wind loading and seismic loading based on the structure size parameter. The CFAT 110 then calculates the amount of each component of concrete used in the based on the information gathered in step 304 of FIG. 3A using the following equation:

$$C_k = P_k \times Q_j \times A$$

Where $C_k$ is the amount of each component used in the concrete, $P_k$ is the proportion of each component used in the concrete, $Q_k$ is the total amount of concrete used and A is the structure size or floor area gathered in Step 304 of FIG. 3A.

Figure 6A:
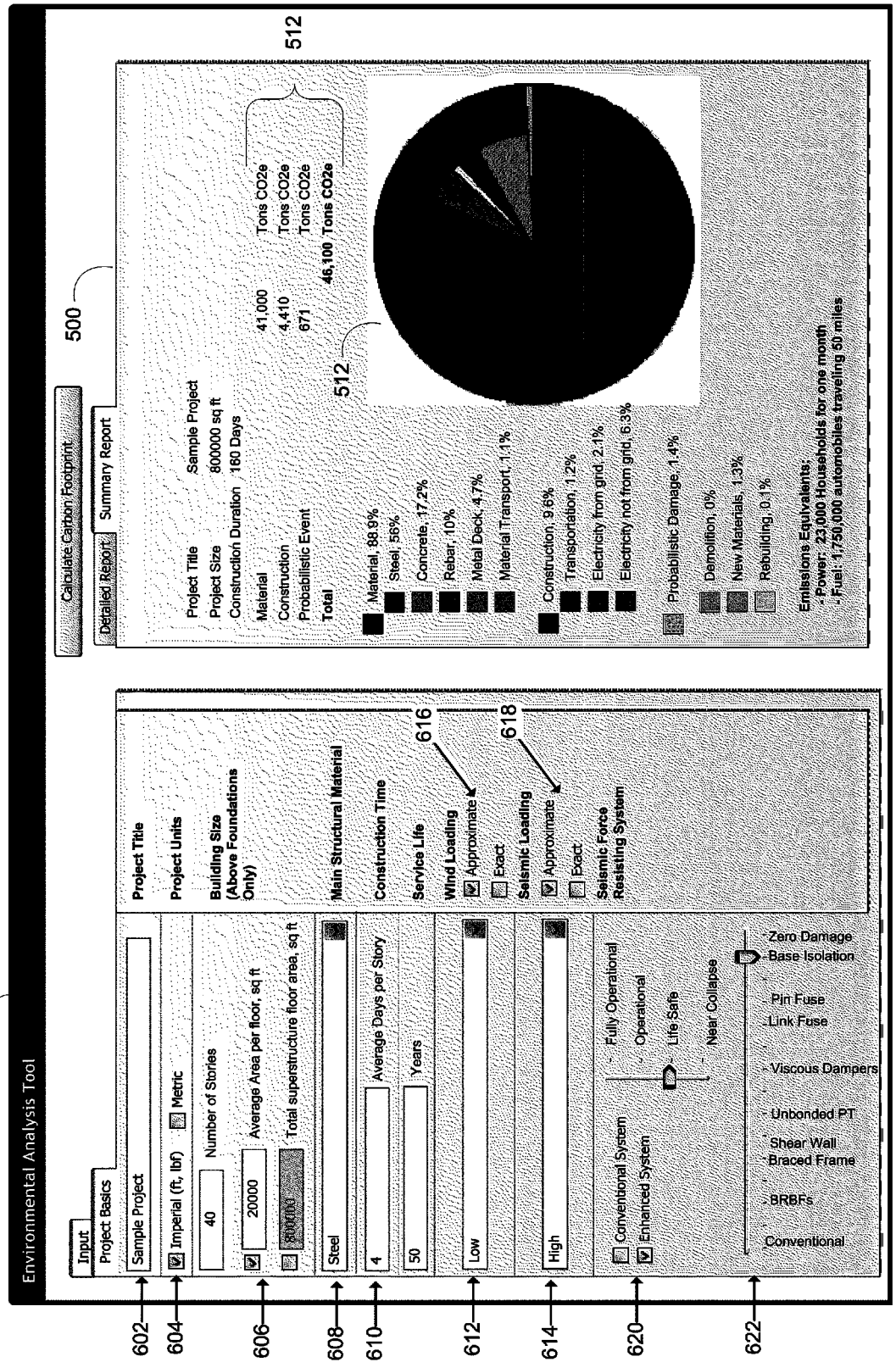
FIGS. 6A and 6B depict illustrative examples of a graphical user interface used to gather information consistent with the present invention.

FIG. 6A represents an illustrative example of a GUI 600 used to gather information consistent with the present invention. The GUI 600 includes a plurality of user input objects, which allow a user to enter information pertaining to the structure. The GUI 600 may include, but is not limited to, input objects requesting a project title 602 and the dimensional units used to calculate the carbon emissions 604. The GUI 600 may also include a structure dimension area 606 for entry of size parameters of the structure. The size parameters may include, but are not limited to, the number of floors in the structure and may allow the entry of the average floor area of each floor or the total superstructure area of the structure.

The GUI 600 may also include an area where a user can define the main structural material used to make the structure 608. The user may be able to select from a plurality of materials including, but not limited to steel, concrete, wood or any other suitable material for construction. The GUI 600 may also include a construction time area 610 for entry of the average days each story will require to complete.

Additional areas may include, but are not limited to, an area to rate the wind loading of the structure 612 and an area to enter the seismic loading of the structure 614. The wind loading and seismic loading of the structure may be entered as a rating or as an exact number. The GUI 600 may include a selection button 616 and 618 that allow the user to indicate if the wind loading and seismic loading are exact numbers or an approximate rating. The approximate rating may be, but is not limited to low, medium or high or any other rating that will indicate a scale for the wind or seismic loading based on the geographical location of the structure.

The GUI 600, shown in FIG. 6A, may also include a seismic force resistive system area 618 for entry of information concerning the seismic force resistive system installed on the structure. The seismic force resistive system area 620 may include a selection button, which allows a user to indicate if the seismic force resistive system is a conventional system or an enhanced system. If the user selects the conventional system button, the GUI will require the user to select the performance level of the structure from a predetermined list 622. If the user selects the enhanced system, the user is allowed to select both the performance level as well as the seismic loading the structure was designed to tolerate.

Figure 6B:
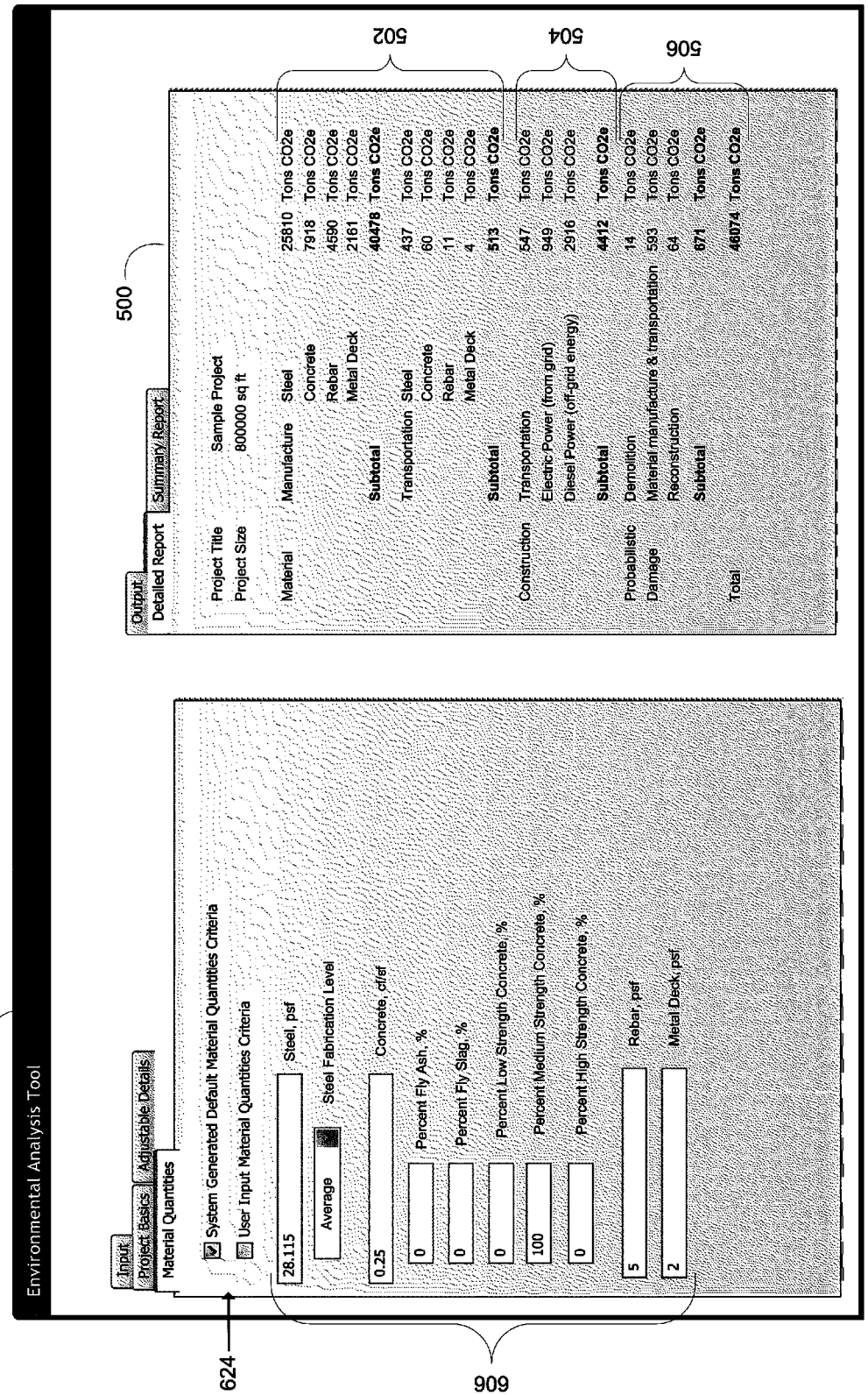

The GUI 600, shown in FIG. 6B, may include a material quantity area 624, which allows the user to select whether the CFAT 110 will generate the material quantities used in the carbon footprint estimate or if the user will manually enter the material quantities to use in the estimate. If the user selects to manually enter the material quantities, a input area 626 will appear which allow the user to enter information pertaining to the amount of each type of material used in the structure which may include, but is not limited to, the pounds per square foot of material used, the components of the material, and the strength of the material.

The CFAT 110 allows a user to estimate the amount carbon generated by the construction of a structure and for any repairs of damage caused by a destructive event. This allows a user to adjust various attributes of the structure to obtain a desired carbon footprint. By doing this, a user is able to determine the most environmentally friendly method of constructing a structure. In addition, because the software calculates the amount and types of material and labor required to repair the structure after a destructive event, the total cost of a structure over its life span is realized.

What is claimed is:

1. An emission estimation apparatus including a memory and a processor running a program configured to perform a method of calculating an estimated amount of total carbon generated during a life span of a structure, the method including the steps of:
    displaying, on a display unit, a graphical user interface stored in the memory of the apparatus which is configured to gather information pertaining to the structure;
    receiving, by the processor, structural information from the graphical user interface into the memory of the apparatus which includes information pertaining to the size and types of material used in the structure;
    calculating, an estimated amount of carbon generated from each type of material used to construct the structure and an estimated amount of carbon generated from a labor force used to construct the structure, based on the structural information received by the processor;
    estimating, by the processor, a type of repair material and an amount of repair material and a repair labor force required to the structure after a destructive event occurs based on a calculated probability that the destructive event of a certain magnitude will occur;
    determining an estimated amount of carbon, generated as a result of the type of repair material, the amount of repair material, and the repair labor force required to repair the structure after the destructive event occurs; and
    displaying, on the display unit, the estimated total amount of carbon emitted due to construction and repair of the structure.

2. The emission estimation apparatus of claim 1 wherein, the estimation of carbon generated during the construction of the structure includes an amount of carbon generated by a manufacture of the material used during construction of the structure.

3. The emission estimation apparatus of claim 1 wherein, the estimation of carbon generated during construction of the structure includes the amount of carbon generated by machinery used during construction of the structure.

4. The emission estimation apparatus of claim 1 wherein, the estimation of carbon generated during repair of the structure after the destructive event includes the amount of carbon generated during demolition of damaged portions of the structure.

5. The emission estimation apparatus of claim 1 wherein, the estimation of carbon generated in the repair of the structure after the destructive event includes the amount of carbon generated by the manufacture of the material used in the repair of the structure.

6. The emission estimation apparatus of claim 1 wherein, the estimation of carbon generated in the repair of the structure after the destructive event includes the amount of carbon generated by machinery used in demolition and repair of the structure.

7. The emission estimation apparatus of claim 1 wherein, the estimation of the type and amount of material required to repair the structure after the destructive event includes the step of varying the amount of damage based on a seismic load-resisting system installed on the structure.

8. The emission estimation apparatus of claim 1 wherein, the estimation of the type and amount of material required to repair the structure after the destructive event includes the step of varying an amount of damage based on a wind load-resisting system installed on the structure.

9. The emission estimation apparatus of claim 1 wherein, the program queries a structural component database resident in the memory of the apparatus to determine an amount of material used in the construction of the structure based on the information pertaining to the design of the structure.

10. The emission estimation apparatus of claim 1 wherein, the program queries a structural component database resident in the memory of the apparatus to determine an amount of material used in the repair of the structure based on the information pertaining to a design of the structure.

11. An emission estimation system including:
    a graphical user interface stored in a memory of an apparatus which is configured to gather information pertaining to characteristics of a structure;
    a structural information receiving unit which receives structural information from the graphical user interface which includes information pertaining to a size and a type of material used in the structure and aspects of the structure;
    a carbon estimation unit configured to estimate an amount of carbon generated as a result of the use of each type of material used in the construction of the structure and a labor force used to in the construction of the structure based on the structural information received;
    a repair estimation unit configured to calculate a probability of a structural event of a certain magnitude occurring, to estimate the types and amounts of repair material and repair labor required to repair the structure after a destructive event occurs and to estimate an amount of carbon resulting from the use of each type of repair material used to repair the structure and the repair labor required to repair the structure after the destructive event; and
    a display unit configured to display the total estimated amount of carbon generated during construction and repair of the structure.

12. The emission estimation apparatus of claim 11 wherein. the estimation of carbon generated during construction of the structure includes an amount of carbon generated by a manufacture of the material used during construction of the structure.

13. The emission estimation system of claim 11 wherein, the estimation of carbon generated in the construction of the structure includes an amount of carbon generated by a machine in during constriction of the structure 14. The emission estimation system of claim 11 wherein, the estimation of carbon generated in the repair of the structure after the destructive event includes the amount of carbon generated by a demolition and a reconstruction of the damaged portions of the structure.

15. The emission estimation system of claim 11 wherein, the estimation of carbon generated in the repair of the structure after the destructive event includes the amount of carbon generated by a manufacture of the material used during the repair of the structure.

16. The emission estimation system of claim 11 wherein, the estimation of carbon generated in the repair of the structure after the destructive event includes the amount of carbon generated by machine used in demolition and repair of the structure.

17. The emission estimation system of claim 11 wherein, the estimation of the type and amount of material required to repair the structure after the destructive event includes the step of varying the amount of damage based on a seismic load-resisting system installed on the structure.

18. The emission estimation system of claim 11 wherein, the estimation of the type and amount of material required to repair the structure after the destructive event includes the step of varying the amount of damage based on a wind load-resisting system installed on the structure.

19. The emission estimation system of claim 11 wherein, a program queries a structural component database resident in the memory of the apparatus to determine the amount of material used in the construction of the structure based on the information pertaining, to the design of the structure.

20. The emission estimation system of claim 11 wherein. a program queries a structural component database resident in the memory of the apparatus to determine the amount of material used in the repair of the structure based on the information pertaining to the design of the structure.

* * * * *

UNITED STATES PATENT AND TRADEMARK OFFICE
CERTIFICATE OF CORRECTION

PATENT NO. : 8,452,573 B2  
APPLICATION NO. : 12/697147  
DATED : May 28, 2013  
INVENTOR(S) : Mark Sarkisian et al.

Page 1 of 1

It is certified that error appears in the above-identified patent and that said Letters Patent is hereby corrected as shown below:

On the Title page of the patent:

(75) "Moshen Nasr"

should be

(75) --Mohsen Nasr--

Signed and Sealed this  
Twenty-third Day of July, 2013

Teresa Stanek Rea  
*Acting Director of the United States Patent and Trademark Office*